United States Patent
Cook et al.

(10) Patent No.: US 6,331,446 B1
(45) Date of Patent: *Dec. 18, 2001

(54) PROCESS FOR UNDERFILLING A CONTROLLED COLLAPSE CHIP CONNECTION (C4) INTEGRATED CIRCUIT PACKAGE WITH AN UNDERFILL MATERIAL THAT IS HEATED TO A PARTIAL GEL STATE

(75) Inventors: Duane Cook; Venkatesan Murali, both of San Jose; Suresh Ramalingam, Fremont; Nagesh Vodrahalli, Cupertino, all of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/261,648

(22) Filed: Mar. 3, 1999

(51) Int. Cl.[7] ............ H01L 21/44; H01L 21/48; H01L 21/50
(52) U.S. Cl. ............ 438/106; 438/118; 438/119
(58) Field of Search ............ 438/51, 55, 64, 438/108, 118, 119, 122, 127

(56) References Cited

U.S. PATENT DOCUMENTS

| | | |
|---|---|---|
| 4,322,737 | 3/1982 | Silva, Jr. . |
| 5,321,583 | 6/1994 | McMahon . |
| 5,629,566 | 5/1997 | Doi et al. . |
| 5,751,556 | 5/1998 | Butler et al. . |
| 5,766,982 | 6/1998 | Akram et al. ............ 438/51 |
| 5,804,771 | 9/1998 | McMahon et al. . |
| 5,815,372 | 9/1998 | Gallas . |
| 5,864,178 | 1/1999 | Yamada et al. . |
| 5,880,017 | 3/1999 | Schwiebert et al. . |
| 5,891,753 | 4/1999 | Akram ............ 438/108 |
| 5,917,702 | 6/1999 | Barrow . |
| 5,919,329 | 7/1999 | Banks et al. ............ 156/281 |
| 5,920,120 | 7/1999 | Webb et al. . |
| 5,936,304 | 8/1999 | Lii et al. . |
| 5,942,805 | 8/1999 | Winer et al. . |
| 5,953,814 | 9/1999 | Sozansky et al. ............ 29/840 |
| 5,959,362 | 9/1999 | Yoshino . |
| 5,965,937 | 10/1999 | Chiu et al. . |
| 5,973,930 | 10/1999 | Ikeda et al. . |
| 5,981,313 | 11/1999 | Tanaka . |
| 5,990,552 | 11/1999 | Xie et al. . |
| 5,991,161 | 11/1999 | Samaras et al. . |
| 5,998,242 | 12/1999 | Kirkpatrick et al. ............ 438/127 |
| 6,001,703 | 12/1999 | Wiener et al. . |
| 6,011,301 | 1/2000 | Chin . |
| 6,016,006 | 1/2000 | Kolman et al. . |
| 6,049,122 | 4/2000 | Yoneda ............ 257/668 |
| 6,049,124 | 4/2000 | Raiser et al. . |
| 6,075,712 | 6/2000 | McMahon . |
| 6,093,972 | 7/2000 | Carney et al. . |

FOREIGN PATENT DOCUMENTS

| | | |
|---|---|---|
| 0 340 492 A2 | 11/1989 | (EP) . |
| 0 778 616 A2 | 6/1997 | (EP) . |
| 0 908 499 A1 | 4/1999 | (EP) . |
| 03040458 | 2/1991 | (JP) . |

OTHER PUBLICATIONS

R. LaChance, et al.; Corrosion/Migration Study of Flip Chip Underfill and Ceramic Overcoating; 1997 Electronic Components and Technology Conference; pp 885–889.

Primary Examiner—David Nelms
Assistant Examiner—Dung A. Le
(74) Attorney, Agent, or Firm—Blakely, Sokoloff, Taylor & Zafman LLP

(57) ABSTRACT

A partial gel step in the underfilling of an integrated circuit that is mounted to a substrate. The process involves dispensing a first underfill material and then heating the underfill material to a partial gel state. The partial gel step may reduce void formation and improve adhesion performance during moisture loading.

35 Claims, 2 Drawing Sheets

PROCESS FOR UNDERFILLING A CONTROLLED COLLAPSE CHIP CONNECTION (C4) INTEGRATED CIRCUIT PACKAGE WITH AN UNDERFILL MATERIAL THAT IS HEATED TO A PARTIAL GEL STATE

BACKGROUND OF THE INVENTION

1. Field of the Invention

The present invention relates to an integrated circuit package.

2. Background Information

Integrated circuits are typically assembled into a package that is soldered to a printed circuit board. FIG. 1 shows a type of integrated circuit package that is commonly referred to as flip chip or C4 package. The integrated circuit 1 contains a number of solder bumps 2 that are soldered to a top surface of a substrate 3.

The substrate 3 is typically constructed from a composite material which has a coefficient of thermal expansion that is different than the coefficient of thermal expansion for the integrated circuit. Any variation in the temperature of the package may cause a resultant differential expansion between the integrated circuit 1 and the substrate 3. The differential expansion may induce stresses that can crack the solder bumps 2. The solder bumps 2 carry electrical current between the integrated circuit 1 and the substrate 3 so that any crack in the bumps 2 may affect the operation of the circuit 1.

The package may include an underfill material 4 that is located between the integrated circuit 1 and the substrate 3. The underfill material 4 is typically an epoxy which strengthens the solder joint reliability and the thermo-mechanical moisture stability of the IC package.

The package may have hundreds of solder bumps 2 arranged in a two dimensional array across the bottom of the integrated circuit 1. The epoxy 4 is typically applied to the solder bump interface by dispensing a single line of uncured epoxy material along one side of the integrated circuit. The epoxy then flows between the solder bumps. The epoxy 4 must be dispensed in a manner that covers all of the solder bumps 2.

It is desirable to dispense the epoxy 4 at only one side of the integrated circuit to insure that air voids are not formed in the underfill. Air voids weaken the structural integrity of the integrated circuit/substrate interface. Additionally, the underfill material 4 must have good adhesion strength with both the substrate 3 and the integrated circuit 1 to prevent delamination during thermal and moisture loading. The epoxy 4 must therefore be a material which is provided in a state that can flow under the entire integrated circuit/substrate interface while having good adhesion properties.

The substrate 3 is typically constructed from a ceramic material. Ceramic materials are relatively expensive to produce in mass quantities. It would therefore be desirable to provide an organic substrate for a C4 package. Organic substrates tend to absorb moisture which may be released during the underfill process. The release of moisture during the underfill process may create voids in the underfill material. Organic substrates also tend to have a higher coefficient of thermal expansion compared to ceramic substrates that may result in higher stresses in the die, underfill and solder bumps. The higher stresses in the epoxy may lead to cracks during thermal loading which propagate into the substrate and cause the package to fail by breaking metal traces. The higher stresses may also lead to die failure during thermal loading and increase the sensitivity to air and moisture voiding. The bumps may extrude into the voids during thermal loading, particularly for packages with a relatively high bump density. It would be desirable to provide a C4 package that utilizes an organic substrate.

SUMMARY OF THE INVENTION

One embodiment of the present invention is an integrated circuit package which may include an integrated circuit that is mounted to a substrate. The package may include an underfill material that is attached to the integrated circuit and the substrate and a fillet which seals the underfill material.

DETAILED DESCRIPTION OF THE INVENTION

Figure 1:
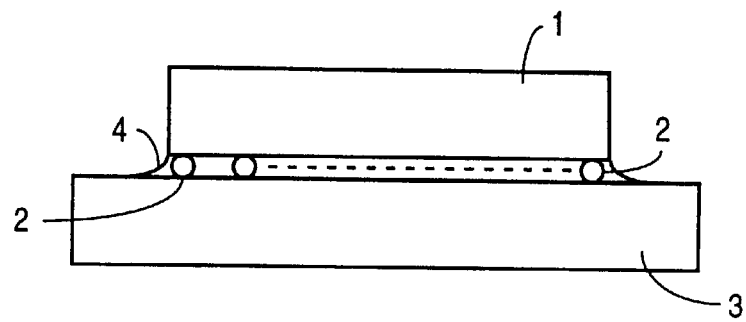
FIG. 1 is a side view of an integrated circuit package of the prior art.
Figure 2:
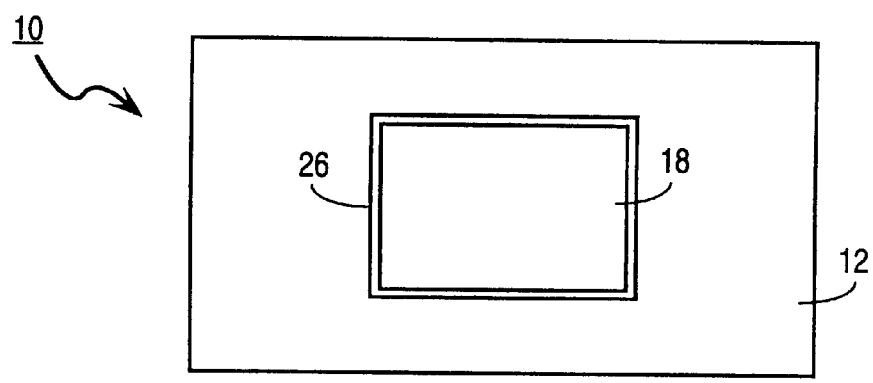
FIG. 2 is a top view of an embodiment of an integrated circuit package of the present invention.
Figure 3:
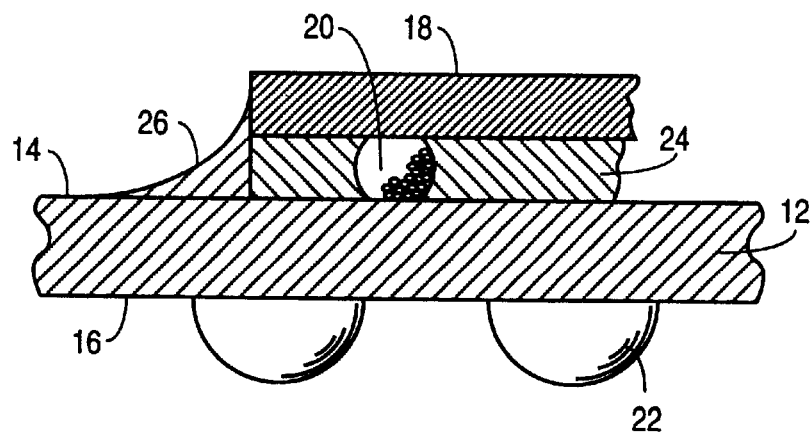
FIG. 3 is an enlarged side view of the integrated circuit package.

Referring to the drawings more particularly by reference numbers, FIGS. 2 and 3 show an embodiment of an integrated circuit package 10 of the present invention. The package 10 may include a substrate 12 which has a first surface 14 and a second opposite surface 16. An integrated circuit 18 may be attached to the first surface 14 of the substrate 12 by a plurality of solder bumps 20. The solder bumps 20 may be arranged in a two-dimensional array across the integrated circuit 18. The solder bumps 20 may be attached to the integrated circuit 18 and to the substrate 12 with a process commonly referred to as controlled collapse chip connection (C4).

The solder bumps 20 may carry electrical current between the integrated circuit 18 and the substrate 12. In one embodiment the substrate 12 may include an organic dielectric material. The package 10 may include a plurality of solder balls 22 that are attached to the second surface 16 of the substrate 12. The solder balls 22 can be reflowed to attach the package 10 to a printed circuit board (not shown).

The substrate 12 may contain routing traces, power/ground planes, vias, etc. which electrically connect the solder bumps 20 on the first surface 14 to the solder balls 22 on the second surface 16. The integrated circuit 18 may be encapsulated by an encapsulant (not shown). Additionally, the package 10 may incorporate a thermal element (not shown) such as a heat slug or a heat sink to remove heat generated by the integrated circuit 18.

The package 10 may include a first underfill material 24 that is attached to the integrated circuit 18 and the substrate 12. The package 10 may also include a second underfill material 26 which is attached to the substrate 12 and the integrated circuit 18. The second underfill material 26 may form a circumferentic fillet that surrounds and seals the edges of the IC and the first underfill material 24. The sealing function of the second material 26 may inhibit moisture migration, cracking of the integrated circuit and cracking of the first underfill material.

The first underfill material 24 may be an epoxy produced by Shin-Itsu of Japan under the product designation Semicoat 5230-JP. The Semicoat 5230-JP material provides favorable flow and adhesion properties. The second underfill material 26 may be an anhydride epoxy produced by Shin-Itsu under the product designation Semicoat 122X. The Semicoat 122X material has lower adhesion properties than the Semicoat 5230-JP material, but much better fracture/crack resistance.

Figure 4:
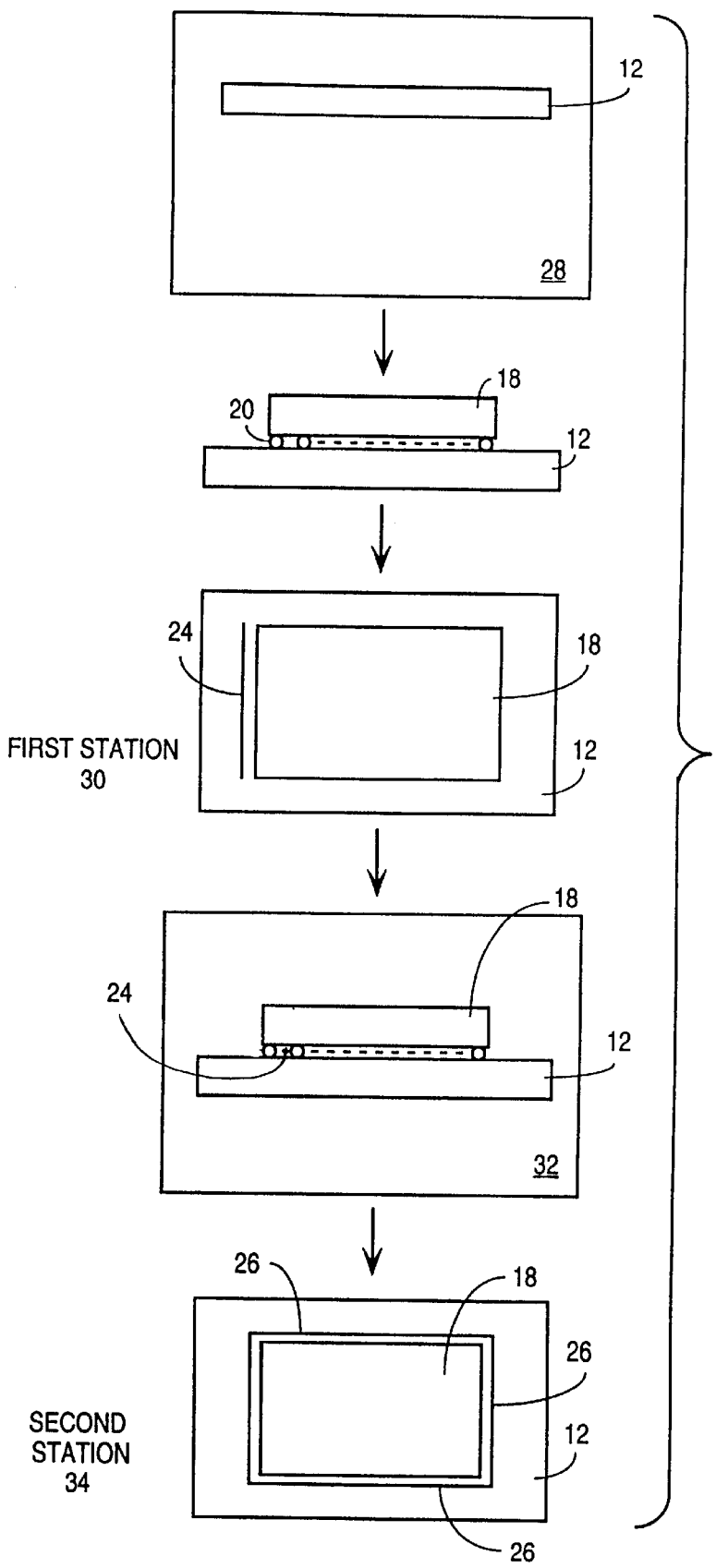
FIG. 4 is a schematic showing a process for assembling the integrated circuit package.

FIG. 4 shows a process for assembling the package 10. The substrate 12 may be initially baked in an oven 28 to remove moisture from the substrate material. The substrate 12 is preferably baked at a temperature greater than the process temperatures of the remaining underfill process steps to insure that moisture is not released from the substrate 12 in the subsequent steps. By way of example, the substrate 12 may be baked at 163 degrees centigrade (°C).

After the baking process, the integrated circuit 18 may be mounted to the substrate 12. The integrated circuit 18 is typically mounted by reflowing the solder bumps 20.

The first underfill material 24 may be dispensed onto the substrate 12 along one side of the integrated circuit 18 at a first dispensing station 30. The first underfill material 24 may flow between the integrated circuit 18 and the substrate 12 under a wicking action. By way of example, the first underfill material 24 may be dispensed at a temperature between 110 to 120° C. There may be a series of dispensing steps to fully fill the space between the integrated circuit 18 and the substrate 12.

The package 10 may be moved through an oven 32 to complete a flow out and partial gel of the first underfill material 24. By way of example, the underfill material 24 may be heated to a temperature from 120–145° C. inclusive in the oven 32 to partially gel the underfill material 24. Partial gelling may reduce void formation and improve the adhesion between the integrated circuit 18 and the underfill material 24. The improvement in adhesion may decrease moisture migration and delamination between underfill material 24 and the IC 18 as well as delamination between underfill material 24 and the substrate 12. The reduction in void formation may decrease the likelihood of bump extrusion during thermal loading. The package may be continuously moved through the oven 32 which heats the underfill material during the wicking process. Continuously moving the substrate 12 during the wicking process decreases the time required to underfill the integrated circuit and thus reduces the cost of producing the package. The substrate 12 can be moved between stations 30 and 34 and through the oven 32 on a conveyer (not shown).

The second underfill material 26 may be dispensed onto the substrate 12 along all four sides of the integrated circuit 18 at a second dispensing station 34. The second material 26 may dispensed in a manner which creates a fillet that encloses and seals the first material 24. By way of example, the second underfill material 26 may be dispensed at a temperature from approximately 80 to 120° C. inclusive.

The first 24 and second 26 underfill materials may be cured into a hardened state. The materials may be cured at a temperature of approximately 150° C. After the underfill materials 24 and 26 are cured, solder balls 22 may be attached to the second surface 16 of the substrate 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A process for underfilling an integrated circuit that is mounted to a substrate, comprising:
   dispensing a first underfill material heated to a first temperature between the integrated circuit and the substrate; and,
   after dispensing the first underfill material, heating the first underfill material to a second temperature greater than the first temperature to achieve a partial gel state.

2. The process of claim 1, further comprising:
   dispensing a second underfill material which becomes attached to the integrated circuit and the substrate.

3. The process of claim 2, wherein
   the second underfill material is dispensed in a pattern which surrounds the first underfill material.

4. The process of claim 2, wherein,
   the first underfill material is an epoxy and the second underfill material is an anhydride epoxy.

5. The process of claim 2, wherein,
   the second underfill material is heated to a fourth temperature.

6. The process of claim 2, further comprising:
   after dispensing the first underfill material heated to the first temperature, then heating the first underfill material to the second temperature to achieve a partial gel state, and then dispensing the second underfill material, heating the first underfill material and the second underfill material to a fifth temperature greater than the first and second temperatures to cure the first underfill material and the second underfill material.

7. The process of claim 1, wherein
   the first underfill material flows between the integrated circuit and the substrate.

8. The process of claim 1, further comprising:
   prior to dispensing the first underfill material heated to the first temperature between the integrated circuit and the substrate, heating the substrate to a third temperature greater than the first and second temperatures.

9. The process of claim 8, wherein
   heating the substrate to the third temperature greater than the first and second temperatures removes moisture from the substrate material and avoids moisture release during the dispensing of the first underfill material at the first temperature and the heating of the first underfill material to the second temperature to achieve the partial gel state.

10. The process of claim 8, wherein,
    the first temperature is in a first temperature range, the second temperature is in a second temperature range greater than the first temperature range, and the third temperature is in a third temperature range greater than the first and second temperature ranges.

11. The process of claim 1, further comprising:
    mounting the integrated circuit to the substrate with a solder bump.

12. The process of claim 11, further comprising:
    attaching a solder ball to the substrate.

13. The process of claim 1, wherein,
    the dispensing of the first underfill material heated to the first temperature includes,
    placing the integrated circuit and the substrate in an oven and
    continuously moving the integrated circuit and the substrate to decrease a time for the first underfill material to flow there-between under a wicking action.

14. The process of claim 1, wherein,
the first underfill material is heated to the first temperature so as to flow between the integrated circuit and the substrate under a wicking action, and
after dispensing, the first underfill material is heated to the second temperature to achieve the partial gel state so as to reduce void formation and improve adhesion between the integrated circuit and the underfill material.

15. A process of underfilling an integrated circuit during assembly in an integrated circuit package, the process comprising:
baking a substrate at a first temperature;
mounting an integrated circuit to said substrate;
dispensing a first underfill material heated to a second temperature less than the first temperature, the first underfill material attaching to the integrated circuit and the substrate; and
heating said first underfill material to a third temperature to partially gel said first underfill material, wherein said first temperature is greater than said second temperature and said third temperature.

16. The process of claim 15, further comprising:
dispensing a second underfill material, the second underfill material attaching to the integrated circuit and the substrate.

17. The process of claim 16, wherein,
the first underfill material is an epoxy and the second underfill material is an anhydride epoxy.

18. The process of claim 16, further comprising:
after dispensing the first underfill material and the second underfill material,
heating the first underfill material and the second underfill material to a fifth temperature greater than the second and third temperatures to cure the first underfill material and the second underfill material.

19. The process of claim 15, wherein,
the mounting of the integrated circuit to the substrate uses a solder bump.

20. The process of claim 19, further comprising:
attaching a solder ball to the substrate.

21. The process of claim 15, wherein
baking the substrate at the first temperature greater than said second and third temperatures removes moisture from the substrate material and avoids moisture release during the dispensing of the first underfill material heated to the second temperature and the heating of said first underfill material to the third temperature to partially gel said first underfill material.

22. The process of claim 15, wherein,
the first underfill material is heated to the second temperature during dispensing so as to flow between the integrated circuit and the substrate under a wicking action, and
after dispensing, the first underfill material is heated to the third temperature to achieve the partial gel state so as to reduce void formation and improve adhesion between the integrated circuit and the underfill material.

23. The process of claim 15, wherein,
the integrated circuit package is a controlled collapse chip connection (C4) integrated circuit package.

24. A process of underfilling an integrated circuit during assembly in an integrated circuit package, the process comprising:
baking a substrate at a first temperature;
mounting an integrated circuit to the substrate;
dispensing a first underfill material heated to a second temperature less than the first temperature, the first underfill material attaching to the integrated circuit and the substrate;
heating the first underfill material to a third temperature greater than the second temperature and less than the first temperature to achieve a partial gel state in the first underfill material; and
dispensing a second underfill material, the second underfill material attaching to the integrated circuit and the substrate.

25. The process of claim 24, wherein,
the mounting of the integrated circuit to the substrate uses one or more solder bumps.

26. The process of claim 25, further comprising:
attaching one or more solder balls to the substrate.

27. The process of claim 24, wherein
the baking of the substrate at the first temperature is greater than the heating of the first underfill to the second and third temperatures, the baking to remove moisture from the substrate material and avoid moisture release during the heating of the first underfill to the second and third temperatures.

28. The process of claim 24, wherein,
the first underfill material is heated to the second temperature during dispensing so as to flow between the integrated circuit and the substrate under a wicking action, and
after dispensing, the first underfill material is heated to the third temperature to achieve the partial gel state so as to reduce void formation and improve adhesion between the integrated circuit and the underfill material.

29. The process of claim 24, wherein,
the first underfill material is an epoxy and the second underfill material is an anhydride epoxy.

30. The process of claim 24, further comprising:
after dispensing the first underfill material and the second underfill material,
heating the first underfill material and the second underfill material to a fifth temperature greater than the second and third temperatures to cure the first underfill material and the second underfill material.

31. The process of claim 24, wherein,
the integrated circuit package is a controlled collapse chip connection (C4) integrated circuit package.

32. A method of reducing void formation and improving adhesion in an integrated circuit packaging process, the method comprising:
first heating a substrate to a temperature greater than temperatures of all subsequent heatings in the process to remove moisture from the substrate and avoid moisture release during subsequent heatings;
mounting an integrated circuit to the substrate to form a subassembly;
first dispensing a first underfill material into a gap between the integrated circuit and the substrate;
second heating the first underfill material to a temperature less than the first heating so it flows into the gap between the integrated circuit and the substrate under a wicking action, the first underfill material attaching to the integrated circuit and the substrate;

third heating the subassembly including the first underfill material to a temperature greater than the second heating to partially gel the first underfill material into a partial gel state to reduce void formation and improve adhesion of the first underfill material to the integrated circuit;

second dispensing a second underfill material onto the substrate along sides of the integrated circuit;

fourth heating the second underfill material to a temperature less than the first heating so that the second underfill material flows around the first underfill material; and, fifth heating the subassembly including the first and second underfill materials to a temperature less than the first heating but greater than the second, third, and fourth heatings to cure the first and second underfill materials.

33. The method of claim 32, wherein, the fourth heating causes the second underfill material to flow around the first underfill material to form a filet and enclose and seal the first underfill material.

34. The method of claim 32, wherein, the substrate is part of a controlled collapse chip connection (C4) integrated circuit package.

35. The method of claim 32, wherein, the first underfill material is an epoxy and the second underfill material is an anhydride epoxy.

* * * * *